United States Patent
Chowdhury et al.

(10) Patent No.: US 10,578,653 B2
(45) Date of Patent: Mar. 3, 2020

(54) OVEREXCITATION PROTECTION FOR ELECTRIC POWER SYSTEM EQUIPMENT

(71) Applicant: Schweitzer Engineering Laboratories, Inc., Pullman, WA (US)

(72) Inventors: Ritwik Chowdhury, Toronto (CA); Dale S. Finney, Little Bras D'or (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/910,226

(22) Filed: Mar. 2, 2018

(65) Prior Publication Data

US 2019/0271725 A1  Sep. 5, 2019

(51) Int. Cl.
| | | |
|---|---|---|
| *H02P 9/00* | (2006.01) | |
| *G01R 19/165* | (2006.01) | |
| *G01R 19/25* | (2006.01) | |
| *H02P 9/10* | (2006.01) | |
| *H02J 3/44* | (2006.01) | |
| *H02H 7/045* | (2006.01) | |

(52) U.S. Cl.
CPC ....... *G01R 19/165* (2013.01); *G01R 19/2513* (2013.01); *H02H 7/045* (2013.01); *H02J 3/44* (2013.01); *H02P 9/105* (2013.01)

(58) Field of Classification Search
CPC .. G01R 19/165; G01R 19/2513; H02H 7/045; H02P 9/105; H02J 3/44; G05B 6/00; G05B 9/00; G05B 17/00
USPC ............ 322/44, 59, 20; 700/30, 42, 22, 286, 700/287, 288, 292
See application file for complete search history.

(56) References Cited

U.S. PATENT DOCUMENTS

| | | | | |
|---|---|---|---|---|
| 4,443,747 A | * | 4/1984 | Chausse | H02P 1/52 318/723 |
| 4,445,080 A | * | 4/1984 | Curtiss | G01R 31/34 318/798 |
| 4,694,374 A | | 10/1987 | Verbanets | |
| 4,806,838 A | * | 2/1989 | Weber | H02P 23/10 318/729 |
| 5,140,243 A | * | 8/1992 | Lyons | H02P 6/18 318/701 |
| 5,805,395 A | | 9/1998 | Hu | |
| 6,505,132 B1 | | 1/2003 | Takaku | |
| 6,672,415 B1 | | 1/2004 | Tabata | |
| 8,232,756 B2 | | 7/2012 | Yoshihara | |

(Continued)

OTHER PUBLICATIONS

David Halliday, Fundamentals of Physics, 1993, John Wiley & Sons, Inc. Fourth Edition, pp. 303, 304.*

(Continued)

*Primary Examiner* — Julio C. Gonzalez
(74) *Attorney, Agent, or Firm* — Richard M. Edge

(57) ABSTRACT

Disclosed are systems and methods to determine an overexcitation condition on electric power delivery system equipment that includes a magnetizing core. Overexcitation conditions are determined even during sub-synchronous resonance, ferro-resonance, and other complex events. Power system voltage is integrated and normalized to determine a flux on the magnetizing core. The flux is compared with a protection model to determine the overexcitation condition on the magnetizing core. Once an overexcitation condition is detected, a protective action may be taken to remove power from the effected power delivery system equipment.

19 Claims, 9 Drawing Sheets

(56) References Cited

U.S. PATENT DOCUMENTS

| | | | | |
|---|---|---|---|---|
| 8,237,426 | B2* | 8/2012 | Chen | H01F 27/42 323/356 |
| 8,553,379 | B2 | 10/2013 | Kasztenny | |
| 9,041,402 | B2 | 5/2015 | Lalonge | |
| 2007/0216396 | A1* | 9/2007 | Coulson | H02M 3/33507 324/117 R |
| 2010/0187916 | A1* | 7/2010 | Saito | G01R 33/0029 307/140 |
| 2011/0080157 | A1* | 4/2011 | Chen | H01F 27/42 323/356 |
| 2011/0175354 | A1* | 7/2011 | Bo | F03D 7/0272 290/44 |
| 2013/0250458 | A1* | 9/2013 | Finney | H02H 3/05 361/42 |
| 2014/0265587 | A1* | 9/2014 | Garces | H02M 7/497 307/52 |
| 2018/0069494 | A1* | 3/2018 | Schneider | H02P 6/182 |
| 2019/0113575 | A1 | 4/2019 | Finney | |

OTHER PUBLICATIONS

Acentech "Technical Brief No. 12, Motor-Operated Valves: Estimating Torque and Motion" 2005.

Basler Electric "Transformer Protection Application Guide" Jun. 2007.

Armando Guzman, Stan Zocholl, Gabriel Benmouyal, Hector Altuve "A Current-Based Solution for Transformer Differential Protection—Part 1: Problem Statement" 2001.

Armando Guzman, Stan Zocholl, Gabriel Benmouyal, Hector Altuve "A Current-Based Solution for Transformer Differential Protection—Part II: Relay Description and Evaluation" 2002.

Dennis Tierney, Bogdan Kasztenny, Dale Finney, Derrick Haas, Bin Le, "Performance of Generator Protection Relays During Off-Nominal Frequency Operation" 2014.

Terry Foxcroft, Normann Fischer, Dale Finney, Satih Samineni, Yu, Xia, "Advanced Generator Protection and Monitoring Using Transducer Measurements" Oct. 2016.

\* cited by examiner

OVEREXCITATION PROTECTION FOR ELECTRIC POWER SYSTEM EQUIPMENT

TECHNICAL FIELD

This disclosure relates to systems and methods for detecting an overexcitation condition on equipment in an electric power system. This disclosure further relates to effecting a protective action in an electric power delivery system upon detection of an overexcitation condition on electric power system equipment.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
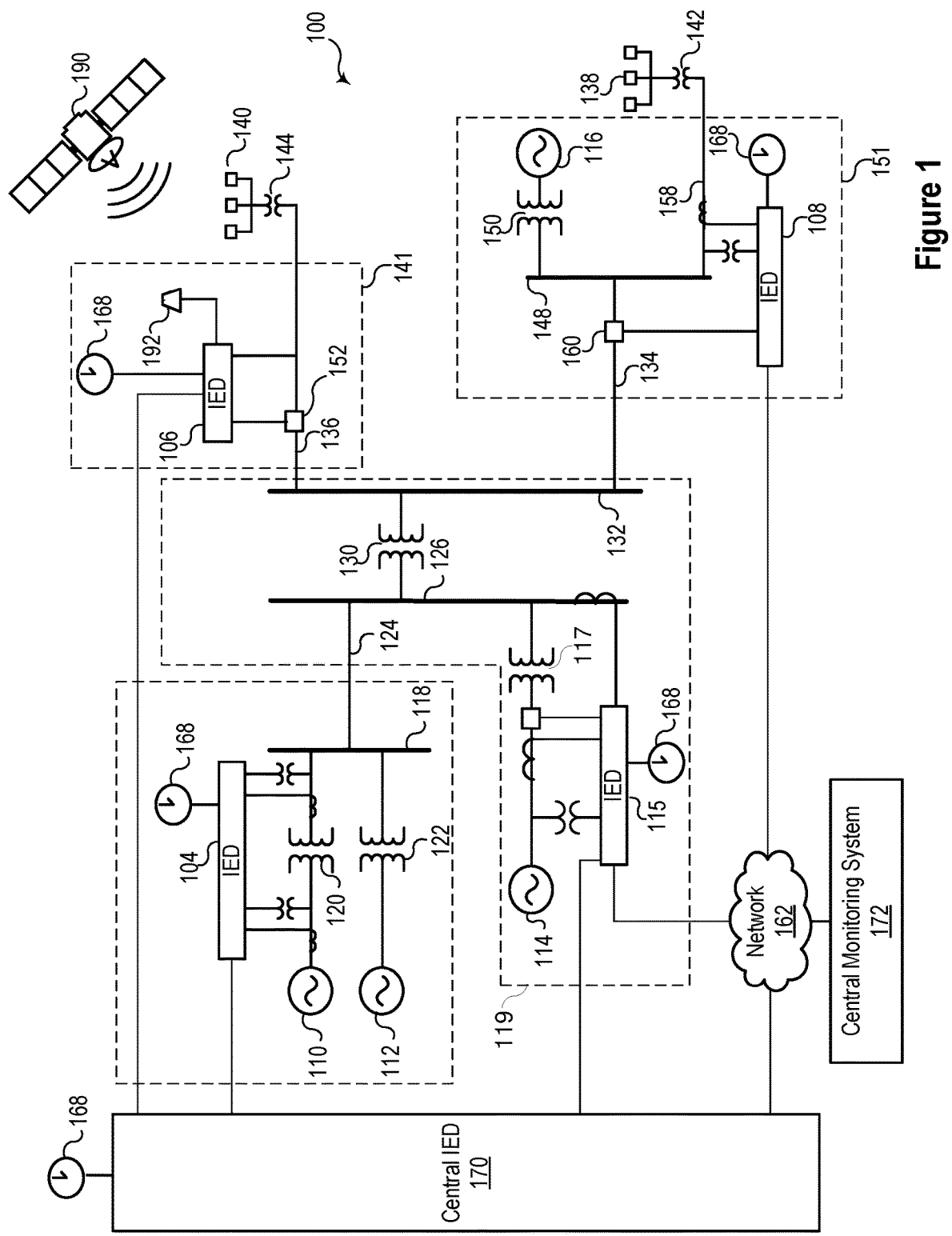
FIG. 1 illustrates a simplified one-line diagram of an electric power delivery system consistent with embodiments of the present disclosure.

Electrical power delivery systems include varied equipment used to maintain the reliability of electric power generation, transmission, and distribution. Certain equipment may rely on magnetizing current and induction to generate electric power or transform electric power from one state to another state. For example, electric power generators generally include a prime mover for rotating a rotor near a stator such that a voltage is induced in the windings of the stator by the rotation of the rotor. In another example, a transformer may include a magnetic core to be able to transform the voltage level from one winding to another.

Electric power applied to the windings of a magnetic core, such as a transformer core or a stator core of an electric power generator, may cause saturation in the core. Transformers are typically operated close to their rated flux. Core saturation results in excessive heating due to reduced power transfer, and may cause faults or shorten the useful life of the equipment. Core saturation may be caused by inrush or overexcitation conditions.

The magnetic flux in a core is directly proportional to the voltage of the electric power applied to the windings of the core; and inversely proportional to the frequency of the electric power applied to the windings of the core. Indeed, overvoltage conditions and underfrequency conditions may individually or in coordination produce flux levels that saturate the core, resulting in overexcitation.

As suggested above, overexcitation may result in overheating, insulation deterioration, increased exciting current, noise, and vibration. A protective action should be taken to remove the electric power supplied to an overexcited core. For example, the protective action may be able to remove the electric power supplied to the core. A control action could also be taken such as reducing the voltage of electric power supplied to the core, increasing the frequency of the electric power supplied to the core, or the like.

Accordingly, what is needed is a system for detecting an overexcited condition of a magnetic core of electric power system equipment and to take a protective action upon detection of the overexcitation condition.

Systems and methods consistent with the present disclosure may monitor the electrical parameters associated with electric power system equipment that use a magnetizing core and induction to identify potentially overexcitation conditions. Such systems and methods may implement various strategies to protect the equipment in the event of an overexcitation condition. In one embodiment, a voltage of the electric power may be used to calculate a flux associated with the equipment core. The calculated flux may be used to determine an overexcitation condition of the equipment, and a protective action may then be effected using the determined overexcitation condition.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or other electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using IEDs that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static VAR compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

FIG. 1 illustrates a simplified one-line diagram of an electric power transmission and distribution system 100 configured to utilize one or more secondary time sources to verify the accuracy of a primary time source consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160), busses (e.g., busses 118, 126, 132, and 148), loads (e.g., loads 140, and 138), and the like. A variety of other types of equipment may also be included in electric power delivery system 100, such as voltage regulators, capacitor banks, and the like.

Substation 119 may include a generator 114, which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further, step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

In various embodiments, IED 104 may be configured to monitor parameters associated with generator 110 and/or transformer 120. Such parameters may include monitoring currents, voltages, frequencies, and/or other electrical conditions of generator 110. IED 104 may be configured to monitor physical parameters associated with generator 110, such as rotational speed, angular position, etc. Such parameters may also be used to calculate a torque caused by connection of generator 110 to the rest of the system 100. Still further, electrical parameters may be monitored to determine presence of an overexcitation condition on the generator 110 in accordance with several embodiments herein.

IED 104 may further be configured to monitor the electrical parameters of transformer 120. Such parameters may include currents, voltages, and/or other electrical conditions of transformer 120. The electrical parameters may be analyzed to determine presence of overexcitation conditions on the transformer 120 in accordance with several embodiments herein.

Network 162 may be used to transmit information among various components in system 100, including IEDs 108, 115, 170, and central monitoring system 172. Information relating to electrical and mechanical parameters associated with rotating machinery in system 100 may be transmitted using network 162. One or more of IEDs, 104, 106, 108, 115, and 170 may be configured to implement the systems and methods contained herein for one or more pieces of rotating machinery in system 100.

A common time signal 168 may be used to time-align measurements for comparison and/or to synchronize action across system 100. Utilizing a common or universal time source may ensure that IEDs have a synchronized time signal that can be used to generate time-synchronized data, such as synchrophasors. In various embodiments, the common time source may comprise a time signal from a global navigation satellite system ("GNSS") system 190. IED 106 may include a receiver 192 configured to receive the time signal from the GNSS system 190. In various embodiments, IED 106 may be configured to distribute the time signal to other components in system 100, such as IEDs 104, 108, 115, and 170.

Figure 2:
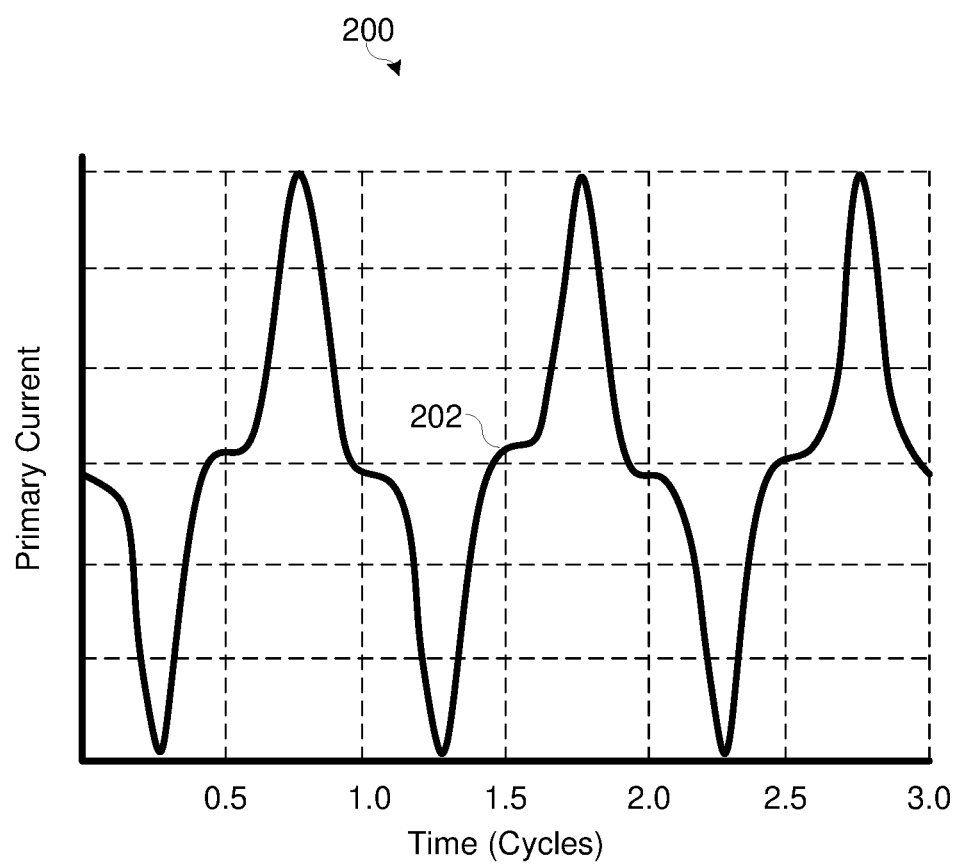
FIG. 2 illustrates a plot of current in an overexcited transformer over a period of three power system cycles.

FIG. 2 illustrates a plot 200 of a primary current 202 in a transformer under overexcitation conditions. The primary current 202 enters one winding and does not leave the other winding, instead dissipating in the transformer core and other components, causing heating and damage if the conditions persists. Overexcitation protection under such conditions may be provided using a volts-per-hertz (V/Hz) function. That is, an IED may measure the voltage and derive the frequency to determine an overexcitation condition using these measurements. For relatively simple events that cause over-fluxing of a magnetic core, the V/Hz calculation may be useful to determine the overexcitation condition. For example, an overvoltage event following a load rejection may cause an overexcitation condition in a magnetic core that may be detected using a V/Hz function. However, for more complex events, the V/Hz function may not adequately be used to detect an overexcitation condition. Transformer differential protection is often used to detect internal faults, and may mis-operate for an over-excitation condition where the current that enters one winding does not leave other windings, similar to what occurs during an internal fault. Of particular interest is the distorted shape of the current signal, rich in $5^{th}$ harmonics. In such cases, a signal that checks the presence of the $5^{th}$ harmonic is used to prevent mis-operation of the transformer differential element during over-excitation conditions.

Complex events that may be experienced on electric power delivery systems, and may cause overexcitation conditions that may fail detection by a V/Hz function include, for example, sub-synchronous resonance, ferro-resonance, and systems near power-electronics based sources that may have harmonic content in the voltages. Power-electronics based sources include, for example, solar power generators, batteries, wind generation, rotating mass storage, and the like that connect to the power system using inverters or other power electronics.

In one example, the system voltage may consist of multiple voltage components at different frequencies. Because the V/Hz function typically uses only a single calculated frequency, the overexcitation condition may not be detected.

In another example, if sub-harmonic frequencies are present in the signal, the zero-crossings may move, resulting in erroneous frequency calculations. Clearly, if the frequency calculations contain errors, the V/Hz function relying on those frequencies will also contain errors.

In yet another example, the IED may be configured to track frequencies over a relatively narrow range. Accordingly, when the actual system frequency falls outside of that range, the V/Hz function will contain errors, and not reliably determine the overexcitation condition in the magnetic core.

Further still, the voltage magnitude could be severely over-estimated or under-estimated and therefore erroneous due to the improper frequency tracking. This will clearly result in errors in the calculated voltage, and, in turn, errors in the V/Hz function. Again, the overexcitation condition may fail detection in such conditions.

In addition to the above, IEDs that use voltage elements such as fundamental and root-means-squared (RMS) overvoltage may not provide adequate voltages for detection of overexcitation conditions using V/Hz functions. These elements typically include filters that do not well represent the various components of system voltage (e.g. an RMS filter will not have unity gain for an inter-harmonic). Further, there is no direct association between voltage magnitude and a damage curve of a power system element.

Figure 3A:
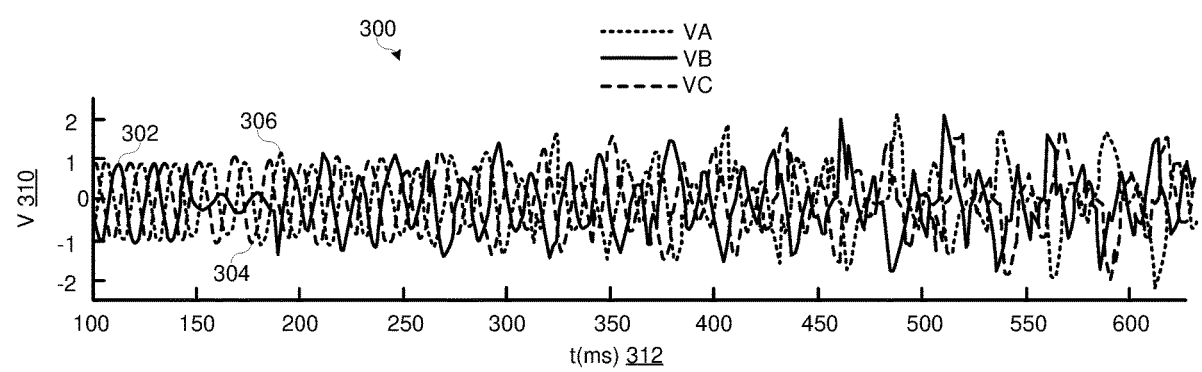
FIG. 3A illustrates a plot of voltage in a transformer over time before and during a power system event.

FIG. 3A illustrates a plot 300 of voltage signals 310 over time 312 from each phase of a three-phase power system before an event, and after clearing of a fault. Voltage signals VA 306, VB 302, and VC 304 are shown in per-unit. It should be noted that at just before time 150 a fault on the B-phase was cleared, resulting in the voltage signal VB 302 falling close to 0. However, instead of the fault clearing, and the system returning to a normal operation, observed is a resultant resonant interaction between wind farm generators and the series-compensated line, resulting in large voltage magnitude and low frequencies that were then imposed on the transformer being monitored.

Figure 3B:
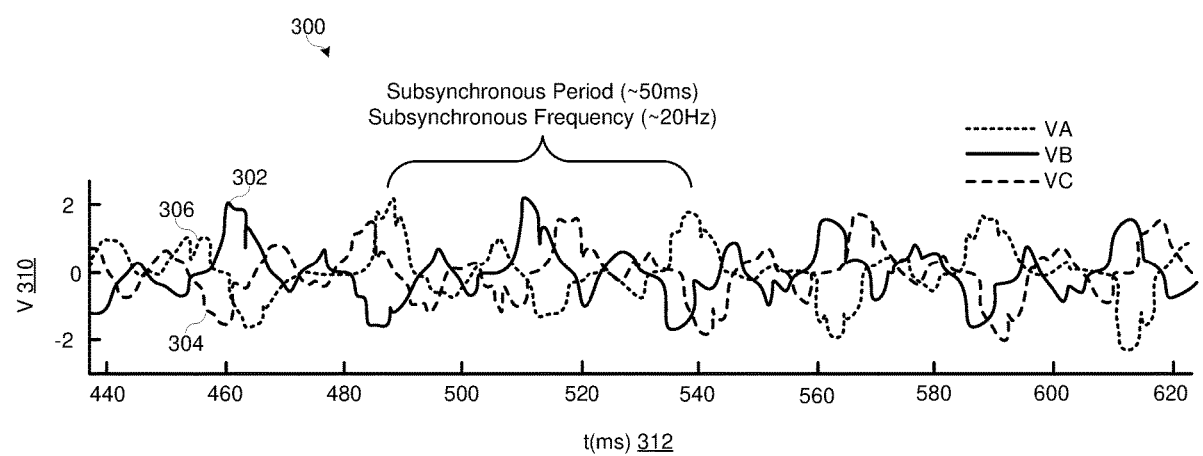
FIG. 3B illustrates a detailed portion of the plot in FIG. 3A.

FIG. 3B illustrates a portion of the plot of FIG. 3A to better illustrate a portion of the voltage signal following the clearing of the fault. Illustrated are the three phase voltages from around time 440 to around time 620. It can be clearly seen that the signals show a sub-synchronous frequency close to 20 Hz, and a voltage larger than 2 per-unit. This overvoltage and under-frequency may result in overexcitation conditions of the transformer.

An IED operating on a V/Hz function alone to detect an overexcitation condition would not have detected the overexcitation condition for several of the reasons illustrated above.

According to several embodiments herein, overexcitation conditions on a magnetizing core may be detected by calculating the flux using the voltage signal. Flux may be determined by calculating the sum of the voltage signal over time or integrating the voltage signal with respect to time.

In one embodiment, an instantaneous flux calculation may result in a flux that does not depend on the power signal frequency. Integrating voltage with respect to time to calculate a flux preserves the effects of all the different frequency components of the system voltage, whereas the V/Hz function is effective only for a sinusoidal system voltage. Furthermore, a flux calculation preserves the initial condition corresponding to the event. For example, the same event occurring at a different point-on-wave could correspond to a different flux through the different legs of the transformer core.

In addition to the above, another advantage of using flux to determine an overexcitation condition of a magnetizing core is improved blocking (or restraining) of the differential protection element during an overexcitation condition. In various embodiments, internal faults may be detected using differential protection over a magnetizing core. For example, differential current may be calculated from the current supplied to the primary windings of a transformer and the current from the secondary windings of the transformer, and used to detect an internal fault in the transformer. Under overexcitation conditions, however, the differential current may exceed a threshold even when no internal fault is present. Blocking or restraining techniques must be used to block or restrain the differential element from tripping the transformer under the overexcitation conditions when no internal fault is present. Traditionally, the fifth harmonic was used to block the differential element. However, the same events which challenge the effectiveness of the traditional Volts/Hz calculation also negatively impact the effectiveness of $5^{th}$ harmonic blocking scheme. This can lead to a differential mis-operation. With the presently-disclosed overexcitation detection using flux, however, the fifth-harmonic differential blocking is not needed to accurately determine an internal fault using the differential element. That is, the flux when exceeding a certain threshold may be used to block or restrain the differential element, and the fifth harmonic current does not need to be calculated to block or restrain the differential element. It has been observed that the problem of using the fifth harmonic current is similar to ones mentioned earlier. That is, a harmonic can only be computed correctly when the fundamental frequency is tracked correctly, furthermore applying to a signal containing only signal frequency.

Calculation of flux may be useful to determine overexcitation conditions on various types of electric power system equipment that include a magnetizing core such as, for example, generators, transformers, phase-shifting transformers, voltage regulators, reactors, motors, current transformers, and the like. Several embodiments described herein are described in terms of determining overexcitation conditions on a transformer. It should be noted, however, that the embodiments described herein may be equally applied to other pieces of electric power system equipment.

Voltage signals are typically obtained using potential transformers such as those illustrated in FIG. 1 in connection with IED 104 obtaining voltage signals from each side of transformer 120, or IED 115 obtaining voltage signals from generator 114. When measuring voltages corresponding to a transformer, the PTs may be connected to the wye winding or delta winding. If the PTs are connected to the delta winding, then phase-to-phase voltages (Vpp) may be used to calculate the flux associated with each leg. If the PTs are connected to the wye winding of the transformer or a generator or other equipment, then phase voltages (Vp) may be used to calculate the flux. In either configuration, flux may be calculated according to Equation 1A:

$$\phi = \frac{1}{N}\int vdt + \phi_0 \qquad \text{Eq. 1A}$$

where:
φ is the calculated flux;
N is the turns ratio of the transformer;
v is the voltage corresponding to the winding (Vpp for phase-to-phase voltages in delta configuration or Vp for phase voltages in wye configuration); and,
$\phi_0$ is the initial flux.

In various embodiments, the value of N may be not known or otherwise unavailable for use in the calculation of the flux value. In the various embodiments that follow, it should be noted that flux linkage may be used to determine an overexcitation condition, similar to the use of flux from Equation 1A to determine an overexcitation condition. In such embodiments, a flux linkage may be calculated according to Equation 1B:

$$\lambda = \int vdt + \lambda_0 \qquad \text{Eq. 1B}$$

where:
λ is the calculated flux linkage;
v is the voltage corresponding to the winding (Vpp for phase-to-phase voltage in delta configuration or Vp for phase voltages in wye configuration); and,
$\lambda_0$ is the initial flux linkage Where the initial flux $\phi_0$ (or initial flux linkage $\lambda_0$) is unknown, either of Equations 1A or 1B may be initialized at steady state at the peak of the voltage waveform, at which point, the flux (e.g. $\phi_0$ of Equation 1A) is zero.

In various other embodiments, Equation 1 may be initialized using other methods to achieve the same objective. For example, in one embodiment, an error removal algorithm is used to remove standing direct current (DC) components via a low-pass filter or similar component. The error removal algorithm removes the initial condition $\phi_0$ over time, and can also correct standing measurement errors. Such alternate implementations or combinations of such implementations, although not separately discussed herein achieve the same objective and are covered by the scope of this disclosure.

Figure 4:
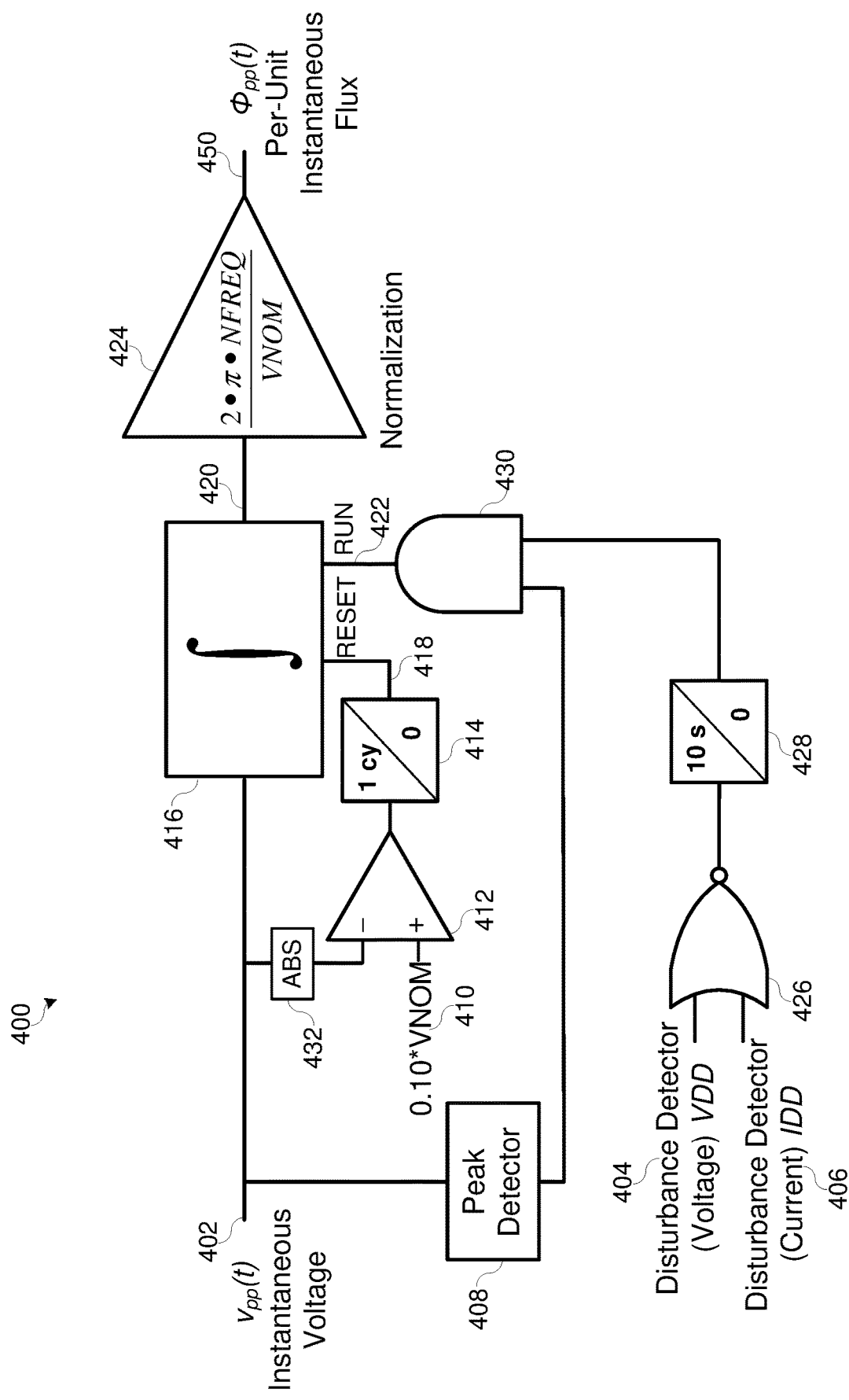
FIG. 4 illustrates a simplified logic diagram for determining a flux in accordance with several embodiments herein.

FIG. 4 illustrates a simplified logic diagram 400 useful for calculating a phase-to-phase per-unit instantaneous flux for a system where the PTs are connected in delta configuration, useful for determining an overexcitation condition on a magnetizing core. According to the illustrated embodiment, the instantaneous phase-to-phase voltage Vpp(t) signal 402 is provided to an IED using, for example, PTs connected to the delta winding of a transformer. An integrator 416 is enabled by AND gate 430. As mentioned above, the integrator is initialized when the core flux is zero, which happens at a peak value of the voltage signal. Accordingly, one input to AND gate 430 is the detection of a peak detector 408. Furthermore, integration by integrator 416 is not initiated when a disturbance has been detected. Accordingly, only when both of a voltage disturbance detector signal 404 and a current disturbance detector signal 406 is absent will inverted OR gate 426 provide a signal to AND gate 430. A timer 428 may be used to ensure steady state by requiring the output of the OR gate 426 to persist for a predetermined time (such as 10 seconds as illustrated) before the steady state signal will be provided to the AND gate 430.

Upon both the steady state signal and the peak detector signal, AND gate 430 will provide run signal 422 to the integrator 416 to run the integration of the provide instantaneous voltage Vpp(t) 402. The integrator 416 integrates the instantaneous voltage signal Vpp(t) 402 to provide a raw flux linkage value 420 that may be used to determine an overexcitation condition.

In various embodiments, the raw flux linkage value 420 may be normalized to provide the instantaneous per-unit phase-to-phase flux signal $\phi_{PP}$ (t) 450. This normalization may eliminate the need to divide the integrated voltage by the turns ratio of the transformer (N in Equation 1). As illustrated, the normalization 424 may be performed by dividing the raw flux linkage 420 by Equation 2:

$$\frac{2*\pi*NFREQ}{VNOM} \quad \text{Eq. 2}$$

where:
NFREQ is the fundamental frequency of the monitored system; and
VNOM is the nominal voltage of the monitored system.

According to various embodiments, the integration 416 may be reset when the voltage is no longer provided across the windings. This may be accomplished by comparing an absolute value 432 of the instantaneous voltage signal Vpp(t) 402 with a threshold value (such as a multiple of the system nominal voltage VNOM) 410 in comparator 412. When the absolute value of the voltage signal falls below the threshold value for a predetermined time (timer 414), then the reset signal 418 is supplied to the integrator 416, and the flux calculation is reset.

It should be noted that the embodiments described in connection with FIG. 4 are described for embodiments where the PTs are connected to a transformer delta winding, resulting in the voltage signal being a phase-to-phase voltage (Vpp(t)) signal, and the calculated flux value being a phase-to-phase per-unit instantaneous flux $\phi_{PP}$ (t) 450. A similar calculation may be made for embodiments where the PTs are connected to the wye winding of the transformer, generator or other equipment, where the signal of interest is a phase voltage (Vp(t)), and the calculated instantaneous per-unit flux $\phi_P$ (t). In any embodiment, the supplied voltage signal is generally referred to as the voltage signal, and the resultant calculated flux is referred to as the flux.

Figure 5A:
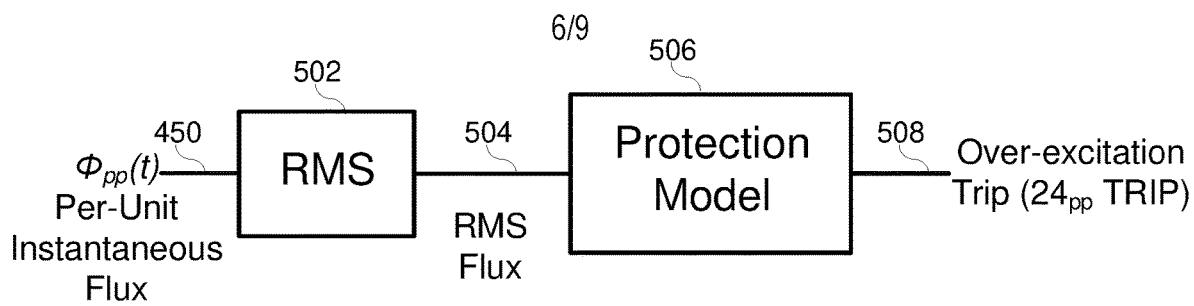
FIG. 5A illustrates a simplified logic diagram of a protective function using flux in accordance with several embodiments herein.

The per-unit instantaneous flux 450 may be used to determine an overexcitation condition of the monitored equipment and to effect a protective action to improve the functioning of the monitored equipment and the overall electric power delivery system. FIG. 5A illustrates a simplified block diagram for determining an overexcitation condition of monitored equipment using the calculated per-unit instantaneous flux 450 according to several embodiments herein. A root-means-square (RMS) block 502 calculates an RMS flux value 504 from the calculated instantaneous flux 450. The RMS window for block 502 should be long enough to capture the sub-harmonic frequencies of interest e.g. 50 ms or larger. The window should be short enough to ensure the element is dependable for severe over-excitation events e.g. 1 s or smaller. The RMS flux value 504 may be applied to a protection model 506 to determine if an overexcitation condition exists and whether a protective action should be taken due to the overexcitation condition 508. In one embodiment, a flux curve may be used in the protection model 506 to determine the overexcitation condition and action to be taken.

Figure 5B:
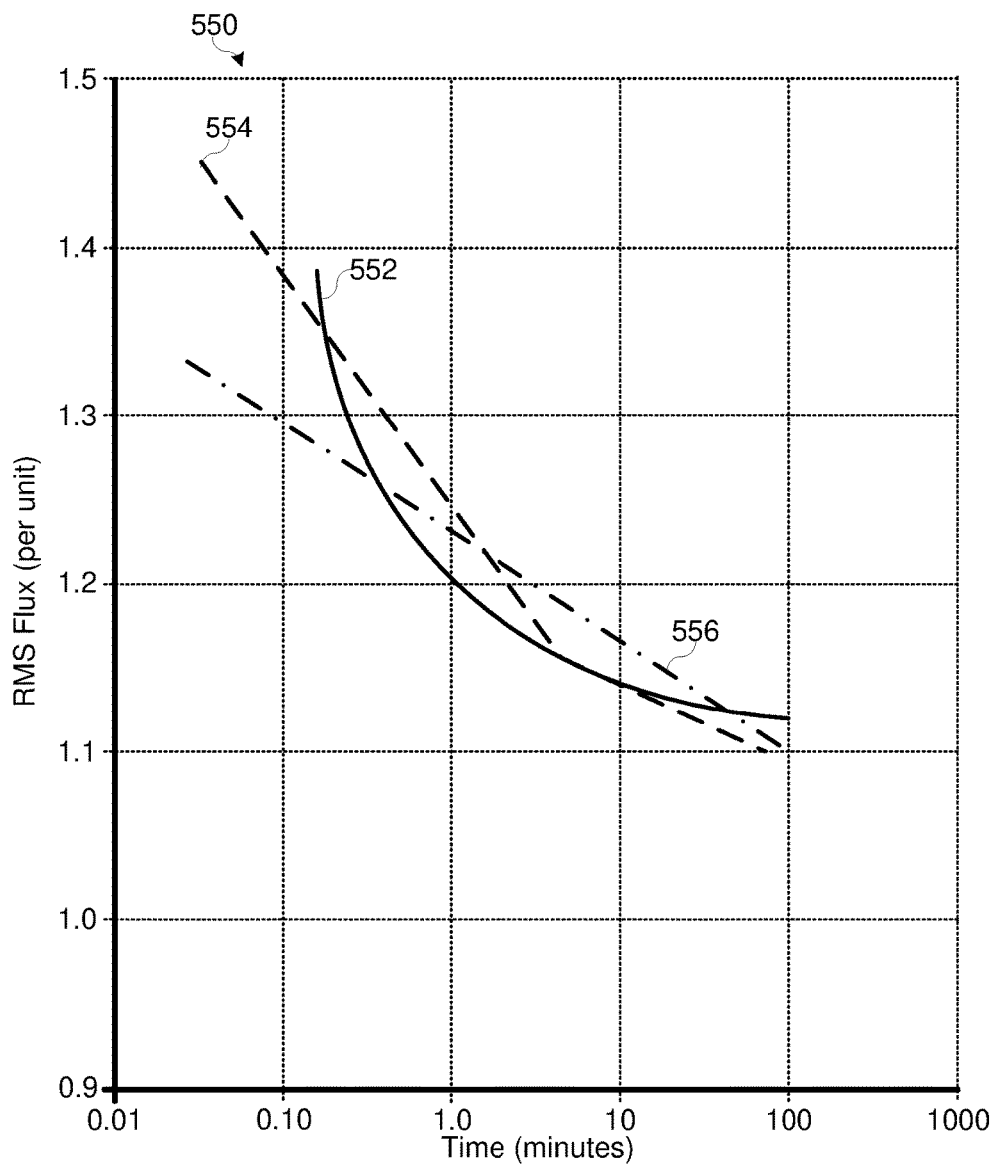
FIG. 5B illustrates a plot of an overexcitation characteristic using flux for three pieces of monitored equipment.

FIG. 5B illustrates a plot 550 of three overexcitation characteristics 552, 554, and 556 using RMS flux (in per-unit) for three pieces of monitored equipment. The protection characteristics are illustrated as thresholds for providing a protective action, such as tripping or opening a breaker, when a level of RMS flux persists for a predetermined time. For example, when the monitored equipment corresponds to the equipment represented by curve 552, the protection model 506 may use curve 552. In this example, if the RMS flux is 20% above normal (1.2 per-unit) for over 1.0 minutes on the equipment represented by curve 552, then the output of the protection model 506 would be an overexcitation trip signal to effect a protective action removing electric power from the monitored equipment. The protection model 506 may use an overexcitation characteristic corresponding with the monitored equipment.

Although the above embodiments describe detection of an overexcitation condition using the protection model and curves associated with FIG. 5B, any appropriate protection model may be used to detect the overexcitation condition using the calculated RMS flux according to various embodiments described herein. In several embodiments, the protection model may be pre-determined and stored by an IED, and selectable by a user. In one particular embodiment, a protection model corresponding with a time vs. percentage V/Hz threshold may be used. The threshold may be produced using set-points describing segments of the model. The set points may be provided by the equipment manufacturer. The set points may be provided in per-unit of V/Hz, and used directly with the per-unit RMS flux of the present disclosure.

In another embodiment, the protection model may be a user-defined curve. The user may be prompted to input a curve or set-points used by the protection model to determine an overexcitation condition and a protective action to take upon determination of the overexcitation condition.

In another embodiment, a protection model such as a thermal model that may or may not be biased by transducer inputs such as resistive temperature detectors (RTDs) may be used as the protection model.

Figure 6:
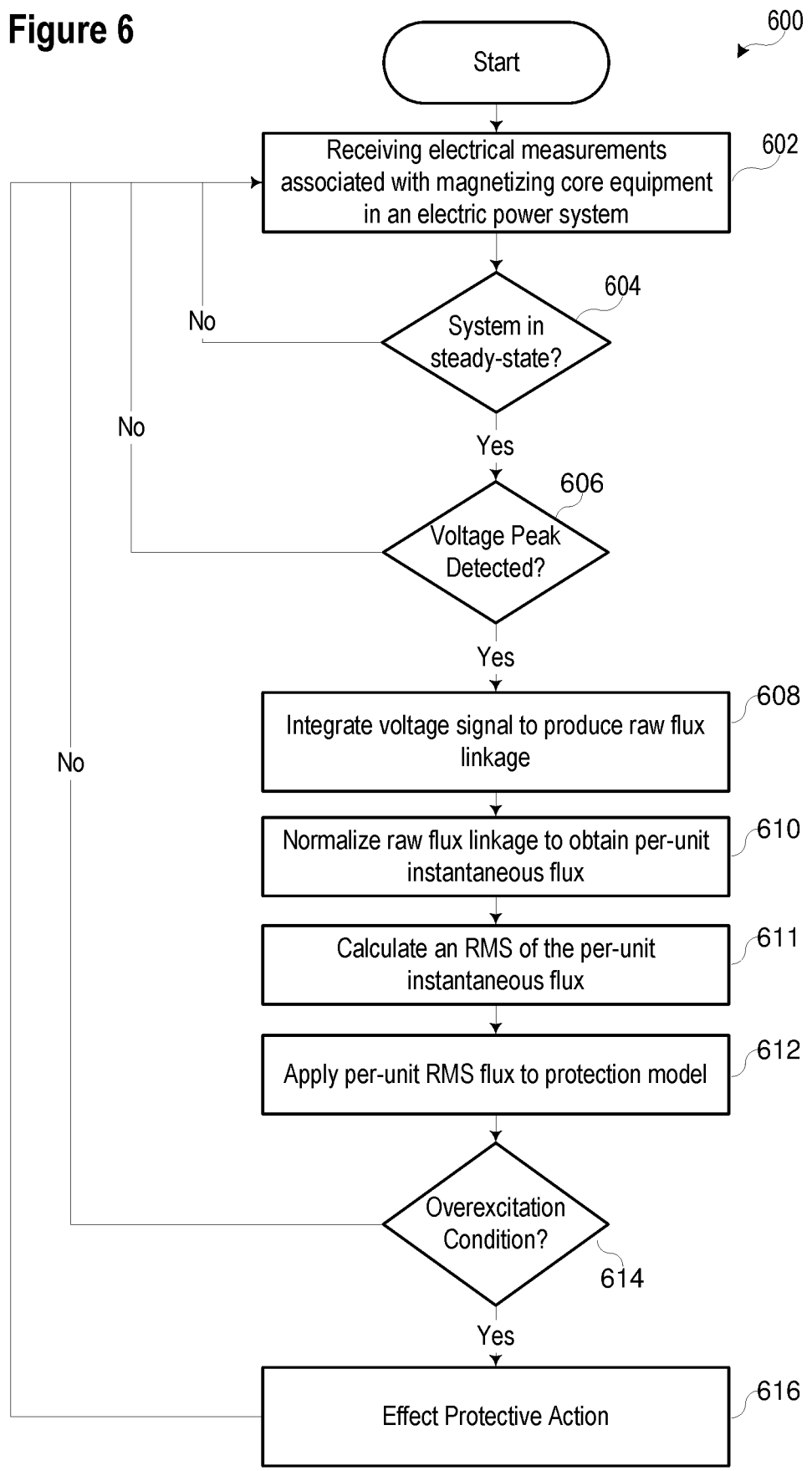
FIG. 6 illustrates a flow chart of a method for detecting overexcitation in accordance with several embodiments herein.

FIG. 6 illustrates a flow chart of a method 600 for detecting an overexcitation condition on monitored equipment that uses a magnetizing core in an electric power system consistent with embodiments of the present disclosure. At 602, electrical measurements associated with magnetizing core equipment (such as, for example, a transformer, a generator, or the like) in an electric power system may be received. In one embodiment, the electrical measurements may comprise the terminal voltages of the monitored equipment. At 604, method 600 may determine whether the electric power system is in a steady state prior to performing the calculations required to determine an overexcitation condition. Various methods may be used to identify if the system is in a steady state, including detection of a change the electrical parameters received at 602. In various embodiments, changes in one or more of a current, or a voltage, and provide an indication that the electric power system is not in a steady state, and as such, method 600 may return to 602 and wait until the electrical parameters are consistent with a steady-state condition. In various embodiments, voltage and current disturbance detectors may be used to determine if the system is in steady state, similar to the system illustrated and described in conjunction with FIG. 4. If the system is not in steady state, then the method returns to 602. In various embodiments, the steady state condition must persist for a predetermined time before the system is determined to be in steady state 604. Furthermore, the method may determine if a voltage peak is detected 606, such that integration can start when the flux is near zero. If a voltage peak is not detected, then the method returns to 602. If the system is in steady state 604 and once a voltage peak is detected 606, then the method proceeds to integrate the voltage signal to produce raw flux linkage values 608. The raw flux linkage values may be normalized to produce per-unit instantaneous flux 610. An RMS calculation of the per-unit instantaneous flux is performed to obtain a per-unit RMS flux quantity 611. The per-unit RMS flux may be applied to a protection model 612. If an overexcitation condition exists 614, then the method may effect a protective action 616 before returning to 602.

It should be noted that various embodiments may not need to determine if a voltage peak is detected. For example, one embodiment may include a low-pass filter to remove DC components of the raw flux linkage value, the instantaneous flux value, the RMS flux or the like, and would not, therefore, need to start the integration at the voltage peak, as is described in the illustrated embodiment.

Figure 7:
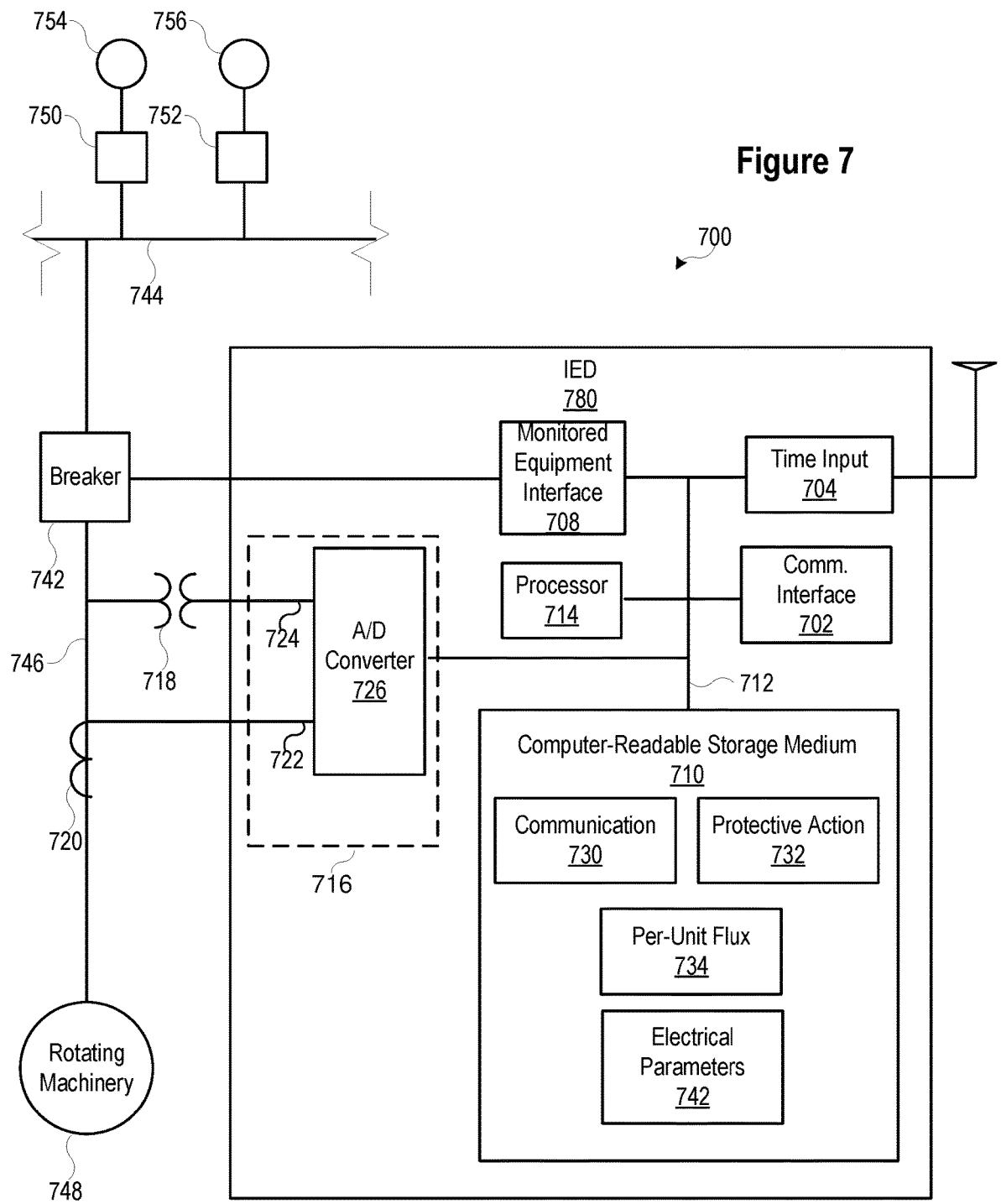
FIG. 7 illustrates a block diagram of a system for providing a protective operation for a portion of an electric power delivery system including rotating machinery.

FIG. 7 illustrates a block diagram of a system 700 comprising an IED 780 configured to detect an overexcitation condition associated with rotating machinery 748 consistent with embodiments of the present disclosure. In various embodiments, IED 780 may comprise a motor relay, a generator relay, a transformer relay, or other device configured to monitor and/or protect the rotating machinery 748. Rotating machinery 748 may be embodied as a generator, a synchronous motor, an asynchronous motor, or any other type of rotating machinery that uses a magnetizing core. Rotating machinery 748 may be selectively connected to a feeder 744 using breaker 742. Feeder 744 may be in electrical communication with an electric power system and rotating machinery may either draw power from or provide power to the electric power system via feeder 744.

Additional power system equipment including, for example, equipment 754 and 756 may also be selectively connected to feeder 744 using breakers 750 and 752, respectively. A switching event associated with any of equipment 748, 754, and 756, or other power system events may create a voltage increase and/or frequency decrease resulting in overexcitation on the magnetizing core of rotating machinery 748, as has been described hereinabove.

The present disclosure provides a technical solution to the technical problem of detecting the overexcitation condition on the magnetizing core of the rotating machinery 748 using IED 780, thus improving the operation of the electric power system. In particular, the functioning of IED 702 is improved by the presently-disclosed overexcitation condition detection.

To that end, IED 780 may include a communication interface 702 configured to communicate with a communication network. IED 780 may communicate with other IEDs or other devices or systems (e.g., a SCADA system, a wide-area situational awareness system, etc.). The communication interface 702 may be embodied as a network interface, optical interface, a serial interface, or a variety of other types of communication interfaces. IED 780 may also include a time input 704, which may be used to receive a time signal from a Navigation Satellite System (GNSS) or other system, such as the WWVB system. In certain embodiments, a common time reference may be received via network interface 702, and accordingly, a separate time input 704 and/or Global time input 706 may not be necessary. One such embodiment may employ the IEEE 1588 protocol.

A monitored equipment interface 708 may be configured to receive equipment status information from, and issue control instructions to a piece of monitored equipment, such breaker 742. In some embodiments, the equipment status information and/or control instructions may be communicated over the communications interface 502.

A computer-readable storage medium 710 may be the repository of one or more modules and/or executable instructions configured to implement any of the processes described herein. A data bus 712 may link monitored equipment interface 708, time input 704, communication interface 702, and the computer-readable storage medium 710 to a processor 714.

Processor 714 may be configured to process communications received via communications interface 702, time input 704, and/or monitored equipment interface 708. Processor 714 may operate using any number of processing rates and architectures. Processor 714 may be configured to perform various algorithms and calculations described herein using computer executable instructions stored on computer-readable storage medium 710. Processor 714 may be embodied as a general purpose integrated circuit, an application specific integrated circuit, a field-programmable gate array, and/or other programmable logic devices.

In certain embodiments, IED 780 may include a sensor component 716. In the illustrated embodiment, sensor component 716 is configured to gather data from a conductor 746 using a voltage transformer 718 and a current transformer 720. Voltage transformer 718 may be configured to step-down the voltage (V) on conductor 746 to a magnitude that can be readily monitored and measured by IED 780. As described in more detail above, the power system may be a three-phase power system illustrated in the one-line diagram of FIG. 7. Accordingly, the line 746 may be a three-phase line with three conductors, each associated with a different phase. PT 718 may be in delta or wye configuration to obtain voltage measurements from the line 746. Similarly, current transformer 720 may be configured to proportionally step-down a current flowing through conductor 746 to a magnitude that can be readily monitored and measured by IED 780. Various other instruments may be used to obtain signals from electric power delivery systems including, for example, Rogowski coils, optical transformers, and the like.

An analog-to-digital converter 726 may sample and/or digitize the measured voltage and/or current signals to form corresponding digitized current and voltage signals. A/D converter 726 may be connected to processor 714 by way of a bus 712, through which digitized representations of current and voltage signals may be transmitted to processor 714. As described above, processor 714 may be used to apply equipment status, measurements, and derived values to an IED module. In some embodiments, a separate device may be used in place of a sensor component 716 for providing signals from the conductor 746 to the IED 780. In some embodiments, a separate device may be configured to obtain signals from the electric power delivery system (such as voltage and/or current signals), and create digitized representations of the signals (for example current and voltage signals), apply a time stamp, and/or supply such information to the IED 780. In certain embodiments, the information that has been described as received from sensor component 716 is instead received from communications interface 702.

A monitored equipment interface 708 may be configured to receive status information from, and issue control instructions to a piece of monitored equipment, such as breaker 742. According to some embodiments, control instructions may also be issued via communications interface 702. Control instructions issued via communications interface 702 may be transmitted, for example, to other distributed controllers, coordination controllers, IEDs, or the like (not shown), which in turn may issue the control instruction to a piece of monitored equipment. Alternatively, the piece of monitored equipment may receive the control instruction directly via its own communications interface.

Computer-readable storage medium 710 may be the repository of one or more modules and/or executable instructions configured to implement certain functions and/or methods described herein. For example, computer-readable storage medium 710 may include instructions for communications 730, protective action 732, calculating per-unit flux 734, and a repository for electrical parameters 742. The modules and/or executable instructions configured to implement various functions described herein. In one specific embodiment, the modules comprised within computer-readable storage medium 710 may be configured to implement method 600, as illustrated in FIG. 6.

The instructions for communications 730 may include instructions for facilitating communication of information from IED 780 to other controllers and/or other components in the electric power delivery system. The instructions may include the formatting of communications according to a variety of communication protocols, as well as instructions for communicating information about flux and overexcitation conditions to other systems.

Electrical parameters 742 may be configured to receive and monitor electrical parameters associated with the electric power system. In the illustrated embodiment, the electrical parameters may be received from sensor component 716. In other embodiments, electrical parameters may be received via communication interface 702. The electrical parameters received by sensor component 716 may be analyzed by electrical parameters module to determine other parameters of interest. For example current measurements may be analyzed to determine a frequency or phase of the electrical energy for purposes of synchronizing rotating machinery 748. Furthermore, nominal values, such as voltage, current, frequency, and the like may be stored in the electrical parameters 742. Protection models such as those used by the protection model 506 of FIG. 5A may be stored in the electrical parameters 742.

Calculation of a per-unit flux 734 may be performed according to the several embodiments herein. For example, the instructions for calculating flux may include determination of system steady state using the voltage and/or current signals obtained using sensor 716; detection of a voltage peak using the voltage signals obtained using sensor 716; integrating the voltage signal to obtain raw flux linkage; normalizing the raw flux linkage using the electrical parameters stored in electrical parameters 742. The per-unit flux calculated may further be an RMS flux as illustrated in FIG. 5A.

Instructions for protective action 732 may be configured to implement one or more action in where per-unit flux calculated in 734 indicates an overexcitation condition that exceeds a protection model stored in the electrical parameters 742. In various embodiments, the protective action 732 may compare the flux to a protection model, determine if a protective action should be taken, and effect the protective action may sending a command to equipment useful for effecting the protective action. For example, the protective action may be disconnection of the rotating machinery 748 from the power system. In such embodiment, the instructions for protective action 732 may format and send a command to open circuit breaker 742. Actions implemented by protective action instructions 732 may include one or more of opening a circuit breaker, adjusting parameters to reduce the overexcitation condition, warning an operator prior to completing the action, and the like.

Figure 8:
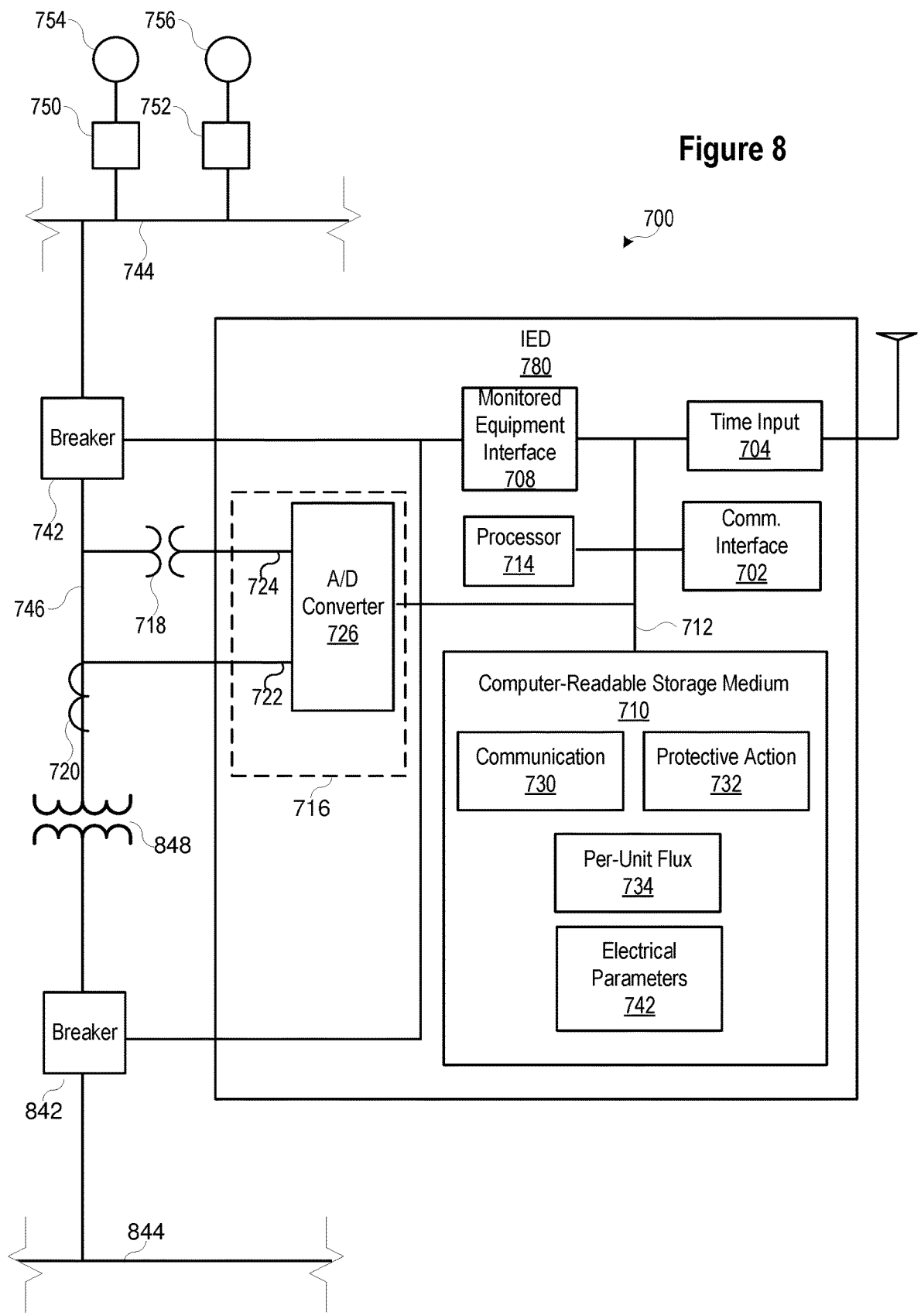
FIG. 8 illustrates a block diagram of a system for providing a protective operation for a portion of an electric power delivery system including a transformer.

Similar to the system illustrated in FIG. 7, FIG. 8 illustrates a simplified block diagram of a system 700 comprising an IED 780 configured to detect an overexcitation condition associated with transformer 848 consistent with embodiments of the present disclosure. Transformer 848 may be used to transform the electric power between bus 744 and bus 844. IED 780 may be configured to detect overexcitation conditions on the transformer 848 using the various embodiments described herein. Although the illustrated embodiment includes obtaining voltages and/or currents from one side of the transformer, the voltages and/or currents from either side or both sides of the transformer may be obtained and used by IED 780 to determine the overexcitation condition and effect the protective action. Furthermore, the protective action may be the opening of breaker 742, breaker 842, or both breakers 742 and 842 to fully isolate the transformer 848 from the power system.

The operation of electric power systems is improved using the disclosures herein by better detection of overexcitation conditions in magnetizing cores of the electric power system, and effecting protective actions on the electric power system when overexcitation conditions are detected. Furthermore, the operation of IEDs is improved using the disclosures herein by more effective detection of overexcitation conditions in magnetizing cores of the electric power system and effecting protective actions on the electric power system when overexcitation conditions are detected.

In particular, the operation of electric power systems and IEDs is improved due to the detection of overexcitation conditions even during conditions that would result in sub-harmonic frequencies, where the overexcitation conditions would not have been detected using V/Hz methods. It has been found that integrating the voltage signal to produce flux, and using this calculated flux to determine an overexcitation condition improves detection of the overexcitation condition.

In one experiment, the V/Hz method is compared with the embodiments described herein under the following conditions:

From time 0 to time 0.5 seconds: Nominal system voltage and frequency;
From time 0.5 to time 1.0 second: 10% frequency drop from 60 Hz to 54 Hz on all three phases;
From time 1.0 to 1.5 seconds: Voltage and frequency are returned to steady state;

From time 1.5 to 2.0 seconds: Subharmonic signals with a frequency of 30 Hz and 45 Hz are introduced; and From time 2.0 to 3.0 seconds: Voltage and frequency are returned to steady state.

Under the above conditions, it was found that the V/Hz method and the embodiments of the present disclosure both detect the initial transient from 0.5 to 1.0 seconds. However, the V/Hz implementation did not detect the transient from time 1.5 to 2.0 seconds, whereas the embodiments of the present disclosure did detect this condition.

Furthermore, it has been observed that under sub-synchronous resonance (SSR) conditions of a voltage increase to a value larger than 2 per-unit with a large 20 Hz frequency component, the V/Hz method did not detect the overexcitation condition, whereas the embodiments described herein did detect the overexcitation condition. Accordingly, the present disclosure describes systems and methods of improving the operation of the electric power system, and systems and methods of improving the operation of IEDs used to protect and control the electric power system.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A device for protecting an electric power delivery system that includes equipment with a magnetizing core, the device comprising:
    a sensor component in electrical communication with a potential transformer of the electric power delivery system, the sensor component including a voltage signal output for providing a voltage signal corresponding with a voltage of the electric power delivery system;
    a processor;
    a computer-readable storage medium in communication with the processor and the sensor component, comprising:
    electrical system parameters;
    a protection model;
    flux instructions that when executed by the processor, cause the device to:
        determine whether the electric power system is operating in steady state using the voltage signal from the sensor component; and
        upon determination of a steady state, integrate the voltage signal to produce a flux value; and
    protective action instructions that when executed by the processor, cause the device to:
        compare the flux value to a protection model;
        determine an overexcitation condition of the magnetizing core based on the comparison of the flux value to the protection model; and,
        upon determination of the overexcitation condition, effect a protective action of the electric power delivery system.

2. The device of claim 1, wherein the flux instructions further cause the device to determine a voltage peak using the voltage signal from the sensor component, and upon detection of a steady state and determination of the voltage peak, integrate the voltage signal to produce a flux quantity.

3. The device of claim 1, wherein the flux instructions further cause the device to remove a standing direct current (DC) component of the flux value.

4. The device of claim 1, wherein the protective action comprises opening a portion of the electric power delivery system to remove electric power from the magnetizing core.

5. The device of claim 1, wherein the equipment with the magnetizing core comprises a transformer.

6. The device of claim 1, wherein the equipment with the magnetizing core comprises a generator.

7. The device of claim 1, wherein the voltage signal comprises a phase-to-phase voltage.

8. The device of claim 1, wherein the voltage signal comprises a phase voltage.

9. The device of claim 1, wherein the voltage signal is integrated to produce a flux linkage, and the flux linkage is normalized using the electric power delivery system fundamental frequency and nominal voltage stored in the electrical system parameters to obtain the flux value comprising a per-unit flux.

10. The device of claim 1, wherein the flux instructions further cause the device to reset the integration of the voltage signal upon the voltage signal falling below a predetermined threshold.

11. The device of claim 1, wherein the protection model is user defined.

12. The device of claim 1, wherein the flux instructions further cause the device to block a differential protection element upon determination of the overexcitation condition.

13. A method for protecting an electric power delivery system that includes equipment with a magnetizing core, the method comprising:
    receiving a voltage signal proportional to a voltage of the electric power delivery system;
    determining whether the electric power system is operating in steady state using the voltage signal;
    upon determination of the steady state, integrating the voltage signal to produce a flux value;
    comparing the flux value to a protection model;
    determining an overexcitation condition of the magnetizing core based on the comparison of the flux value to the protection model; and
    upon determination of the overexcitation condition, effecting a protective action of the electric power delivery system.

14. The method of claim 13, further comprising determining a voltage peak using the voltage signal, and upon determination of both the steady state and the voltage peak, integrating the voltage signal to product the flux value.

15. The method of clam 13, further comprising removing a standing direct current (DC) component of the flux value.

16. The method of claim 13, wherein the protective action comprises opening a portion of the electric power delivery system to remove electric power from the magnetizing core.

17. The method of claim 13, wherein the step of integrating comprises integrating the voltage signal to produce a flux linkage, and the method further comprises the step of normalizing the flux linkage using the electric power delivery system fundamental frequency and nominal voltage to obtain the flux value comprising a per-unit flux.

18. The method of claim 13, further comprising the step of blocking a differential protection element upon determination of the overexcitation condition.

19. A device for protecting an electric power delivery system that includes equipment with a magnetizing core, the device comprising:

a sensor component in electrical communication with a potential transformer of the electric power delivery system, the sensor component including a voltage signal output for providing a voltage signal corresponding with a voltage of the electric power delivery system;

a processor;

a computer-readable storage medium in communication with the processor and the sensor component, comprising:

electrical system parameters;

a protection model;

flux instructions that when executed by the processor, cause the device to:
  determine whether the electric power system is operating in steady state using the voltage signal from the sensor component;
  upon determination of a steady state, integrate the voltage signal to produce a flux value; and,
  reset the integration of the voltage signal upon the voltage signal falling below a predetermined threshold; and protective action instructions that when executed by the processor, cause the device to:
  compare the flux value to a protection model;
  determine an overexcitation condition of the magnetizing core based on the comparison of the flux value to the protection model; and,
  upon determination of the overexcitation condition, effect a protective action of the electric power delivery system.

* * * * *